(12) United States Patent
Hooper et al.

(10) Patent No.: US 9,663,350 B2
(45) Date of Patent: May 30, 2017

(54) STRESS ISOLATED DIFFERENTIAL PRESSURE SENSOR

(71) Applicant: FREESCALE SEMICONDUCTOR, INC., Austin, TX (US)

(72) Inventors: Stephen R. Hooper, Mesa, TX (US); Chad S. Dawson, Queen Creek, TX (US)

(73) Assignee: NXP USA, Inc., Austin, TX (US)

( * ) Notice: Subject to any disclaimer, the term of this patent is extended or adjusted under 35 U.S.C. 154(b) by 378 days.

(21) Appl. No.: 14/569,068

(22) Filed: Dec. 12, 2014

(65) Prior Publication Data

US 2016/0169758 A1 Jun. 16, 2016

(51) Int. Cl.
| | |
|---|---|
| G01L 7/08 | (2006.01) |
| G01L 9/00 | (2006.01) |
| G01L 9/06 | (2006.01) |
| B81B 7/00 | (2006.01) |
| G01L 13/02 | (2006.01) |
| G01L 15/00 | (2006.01) |

(52) U.S. Cl.
CPC .......... *B81B 7/0061* (2013.01); *B81B 7/0048* (2013.01); *G01L 9/0073* (2013.01); *G01L 13/025* (2013.01); *G01L 15/00* (2013.01); *B81B 2201/0264* (2013.01); *B81B 2207/012* (2013.01); *B81C 2203/0154* (2013.01); *H01L 2224/48137* (2013.01)

(58) Field of Classification Search
CPC ... G01L 9/0054; G01L 19/141; G01L 9/0073; B81B 7/0058; B81B 2201/0264; B81B 2207/015; B81B 7/0061; H01L 2224/48091; H01L 2224/48247; H01L 2924/1815; H01L 2924/00014; H01L 2224/48465; H01L 2924/00; H01L 2924/1461; H01L 2224/45144; H01L 2924/181; H01L 2924/3025; H01L 2924/15747; B81C 2203/0154; B81C 1/00309; Y10T 29/49126
USPC .............. 73/721, 715–718, 727, 736; 438/51
See application file for complete search history.

(56) References Cited

U.S. PATENT DOCUMENTS

| | | |
|---|---|---|
| 8,359,927 B2 | 1/2013 | Hooper et al. |
| 8,618,620 B2 | 12/2013 | Winkler et al. |

(Continued)

FOREIGN PATENT DOCUMENTS

CN 102331325 A 1/2012

*Primary Examiner* — Lisa Caputo
*Assistant Examiner* — Brandi Hopkins
(74) *Attorney, Agent, or Firm* — Charlene R. Jacobsen

(57) ABSTRACT

A package includes a MEMS die and a cap element coupled to and stacked with the MEMS die. The MEMS die includes at least two physically isolated pressure sensors, each of which resides on its individual cantilevered platform structure. A first pressure sensor is vented to a first external environment via a first vent extending through the bottom of the MEMS die and is adapted to detect a first pressure of the first external environment. The MEMS die can be coupled to a lead frame having an opening that is aligned with the first vent. A second sensor is vented to a second external environment via a second vent extending through the cap element and is adapted to detect a second pressure of the second external environment. A difference between the first and second pressures is the differential pressure.

20 Claims, 4 Drawing Sheets

(56) References Cited

U.S. PATENT DOCUMENTS

| | | | |
|---|---|---|---|
| 2010/0133631 A1* | 6/2010 | Benzel | G01L 15/00 257/417 |
| 2012/0042731 A1* | 2/2012 | Lin | G01L 9/0073 73/718 |
| 2013/0221457 A1* | 8/2013 | Conti | B81B 7/0061 257/416 |

* cited by examiner

STRESS ISOLATED DIFFERENTIAL PRESSURE SENSOR

TECHNICAL FIELD OF THE INVENTION

The present invention relates generally to pressure sensor devices. More specifically, the present invention relates to a microelectromechanical systems (MEMS) differential pressure sensor package.

BACKGROUND OF THE INVENTION

Microelectromechanical systems (MEMS) technology is used to integrate mechanical elements, sensors, actuators, and electronics on a common silicon substrate through microfabrication technology. MEMS devices include pressure sensors, accelerometers, gyroscopes, microphones, digital mirror displays, micro fluidic devices, and so forth. MEMS pressure sensor devices, for example, can be used in a wide range of applications, including commercial applications such as air conditioning, fluid level sensing and flow control.

Depending on the nature of the application, different types of pressure sensors are commonly used. Exemplary pressure sensors include absolute pressure sensors and differential pressure sensors. An absolute pressure sensor is a sensor that has an output related to the absolute pressure of an external environment with respect to a known, constant pressure (typically vacuum). A differential pressure sensor, on the other hand, is a sensor whose output is related to a difference in pressures between two regions, and typically includes a semiconductor membrane separating two ports coupled to two different pressure levels. A gauge pressure sensor is generally a differential pressure sensor in which the sensor has an output related to the pressure relative to atmospheric pressure.

Differential pressure sensors may advantageously be used with differential circuits to provide higher linearity and greater noise immunity than the single-ended circuits typically used with absolute pressure sensors. However, there are significant challenges to be surmounted in the packaging of MEMS differential pressure sensors due at least in part to the necessity for the pressure sensors to interact with the outside environment, the fragility of many types of pressure sensors, severe size and cost constraints, and so forth. Indeed, many pressure sensor applications require smaller size and low cost packaging to meet aggressive cost targets. Additionally, pressure sensor applications require configurations that are largely impervious to package stress, which can otherwise cause instability of the pressure sensor and output shifts in the pressure sensor.

Additionally, one or both sides of a differential pressure sensor might be in close proximity to water or other corrosive chemicals. To protect against the corrosive environment, pressure sensors are provided with various coatings, encapsulants, or diaphragms made from various elastic gels, polymers, or other materials. However, these protection schemes can further add to the complexity of manufacturing such sensors, resulting in increased cost, reduced reliability, and/or reduced ability to measure the pressure (e.g., due to the presence of a thick coating on the sensing diaphragm).

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

Embodiments of the present invention entail stress isolated microelectromechanical systems (MEMS) device packages and methodology for fabricating the MEMS device packages. In particular, the MEMS device package entails a differential pressure sensor package configuration in which two pressure sensors are built on the same MEMS die. The pressure sensors are physically isolated from one another so that their pressures are different, and each pressure sensor has its own individual vent, where one vent is in the top of the package through a cap element and the other vent is through the base of the MEMS differential pressure sensor package. Additionally, each pressure sensor is formed on its own cantilevered platform structure which is connected to a bulk substrate at a sole attachment point. Such a configuration enables differential pressure sensing, while providing isolation of the pressure sensors from outside stresses such as packaging and/or thermal stresses. Such a structural configuration and fabrication methodology enables a cost effective differential pressure sensor packaging solution in a compact form factor that does not sacrifice part performance and that additionally does not require gel fill.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

Figure 1:
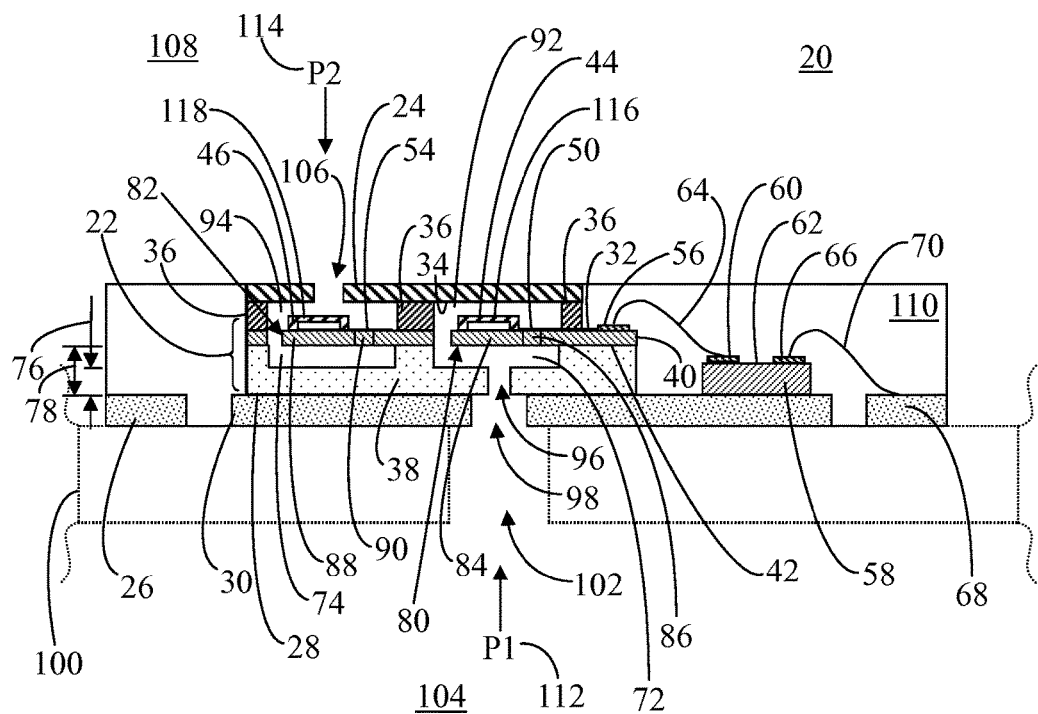
FIG. 1 shows a side view of a microelectromechanical systems (MEMS) differential pressure sensor package.
Figure 2:
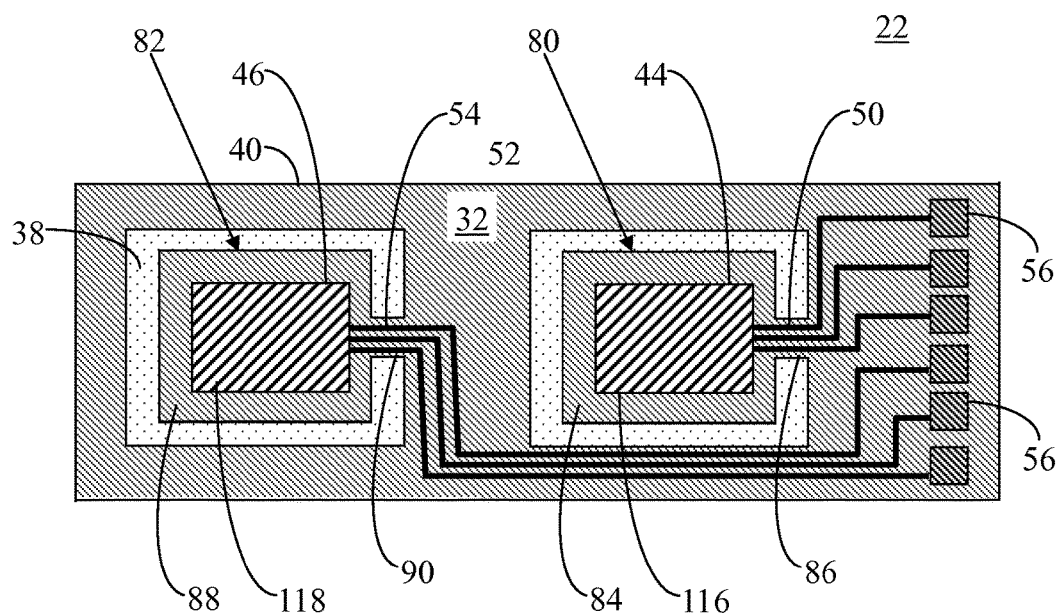
FIG. 2 shows a top view of a MEMS die of the differential pressure sensor package of FIG. 1.
Figure 5:
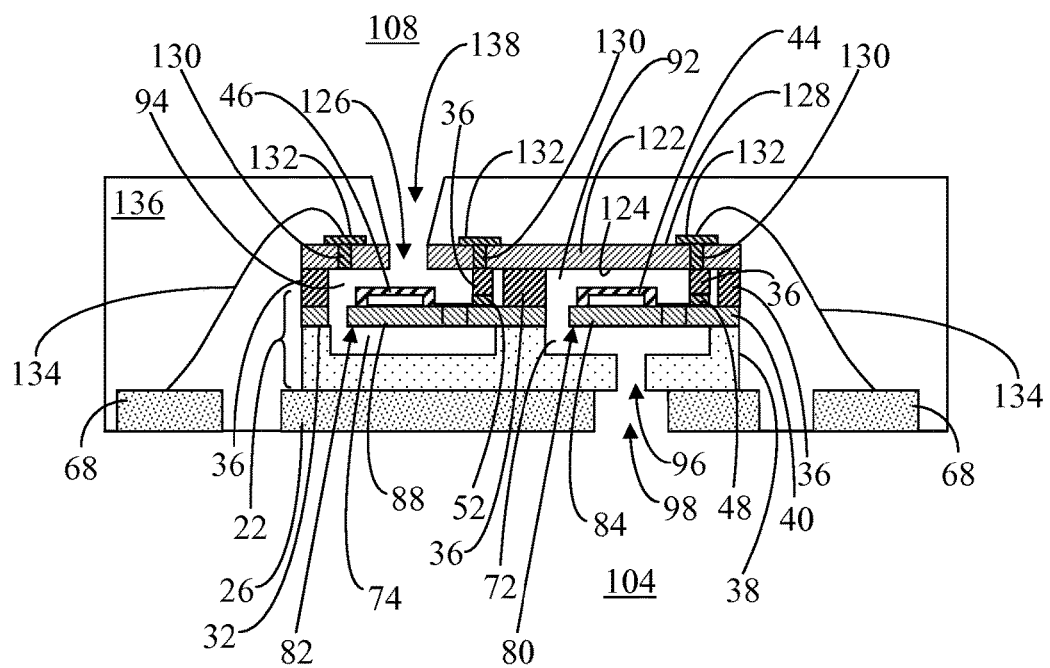
FIG. 5 shows a side view of a MEMS differential pressure sensor package in accordance with another embodiment.

Referring now to FIGS. 1 and 2, FIG. 1 shows a side sectional view of a MEMS differential pressure sensor package 20 in accordance with an embodiment, and FIG. 2 shows a top view of a MEMS die 22 of differential pressure sensor package 20. FIGS. 1-2 and subsequent FIG. 5 are illustrated using various shading and/or hatching to distinguish the different elements of the MEMS differential pressure sensor packages, as will be discussed below. These different elements within the structural layers may be produced utilizing current and upcoming micromachining techniques of depositing, patterning, etching, and so forth. It should further be understood that the use of relational terms, if any, such as first and second, top and bottom, and the like are used solely to distinguish one from another entity or action without necessarily requiring or implying any actual such relationship or order between such entities or actions.

Differential pressure sensor package 20 generally includes MEMS die 22, a cap element 24 coupled to MEMS die 22, and a lead frame 26 to which MEMS die 22 is coupled. More particularly, a back side 28 of MEMS die 22 is coupled to a die attach platform 30 of lead frame 26. A top side 32 of MEMS die 22 is coupled to an inner surface 34 of cap element 24 in a stacked relationship via a bond material 36, where bonding may be, for example, aluminum-germanium bonding, copper-to-copper bonding, or any other suitable bonding process and bonding material. It should be appreciated that cap element 24 and bond material 36 are not shown in the top view of FIG. 2 so that the various elements of MEMS die 22 are visible.

MEMS die 22 generally includes a bulk substrate 38, a structural layer 40 fixed to a surface 42 of bulk substrate 38, a first MEMS device 44, and a second MEMS device 46, wherein first and second MEMS devices 44, 46 are formed on, or alternatively in, structural layer 40. MEMS die 22 may further include conductive traces 50 electrically connected to first MEMS device 44 and conductive traces 54 electrically connected to second MEMS device 46. Conductive traces 50, 54 are best visualized in the top view of FIG. 2. Conductive traces 50, 54 are suitably routed and electrically isolated from one another and from surrounding structures (e.g., cap element 24) in accordance with known methodologies.

Additionally, bond pads 56 may be provided on top side 32 of MEMS die 22 external to cap element 24. Conductive traces 50 suitably electrically couple first MEMS device 44 with at some of bond pads 56. Likewise, conductive traces 54 suitably electrically couple second MEMS device 46 with some of bond pads 56. Accordingly, bond pads 56 are electrically connected to conductive traces 50, 54 so as to provide input to and/or output from either of first and second MEMS devices 44, 46. Only six conductive traces 50, 54 and six bond pads 56 are shown for simplicity of illustration. Those skilled in the art will recognize that there may more than or fewer than the illustrated quantity of conductive traces 50, 54 and bond pads 56 in accordance with a particular design.

MEMS differential pressure sensor package 20 may further include an integrated circuit (IC) die 58 coupled to die attach platform 30 of lead frame 26. Bond pads 60 are provided on an outer surface 62 of IC die 58, and conductive interconnects 64 span between bond pads 56 on MEMS die 22 and bond pads 60 on IC die 58. IC die 58 represents the central unit, e.g., microprocessor, that processes data from MEMS die 22 and therefore provides "intelligence" built into MEMS differential pressure sensor package. IC die 58 further includes bond pads 66 that are interconnected with electrical leads 68 of lead frame 26 via conductive interconnects 70 so as to provide input to and output from MEMS differential pressure sensor package 20. Although MEMS differential pressure sensor package 20 is shown as including only one MEMS die 22 and one IC die 58, it should be understood that package 20 may include any number of MEMS dice 22 and IC dice 58 in accordance with particular design requirements for package 20.

In accordance with an embodiment, bulk substrate 38 of MEMS die 22 has a first recess 72 and a second recess 74, each extending inwardly from surface 42 and partially through bulk substrate 38. As best seen in FIG. 1, each of first and second recesses 72, 74 has a depth 76 that is less than a thickness 78 of bulk substrate 38. Structural layer 40 is fixed to surface 42 of bulk substrate 38 surrounding first and second recesses 72, 74. A material portion of structural layer 40 is removed surrounding first and second MEMS devices 44, 46. Thus, a first cantilevered platform structure 80 is formed at which first MEMS device 44 resides, and a second cantilevered platform structure 82 is formed at which second MEMS device 46 resides. Accordingly, first cantilevered platform structure 80 is formed in structural layer 40 and resides over first recess 72. Likewise, second cantilevered platform structure 82 is formed in structural layer 40 and resides over second recess 74.

First cantilevered platform structure 80 includes a first platform 84 and a first arm 86 extending from first platform 84. First MEMS device 44 resides on first platform 84, with an end of first arm 86 being a sole attachment point of first platform 84 to the surrounding bulk substrate 38. Accordingly, once the material portion of structural layer 40 is removed surrounding first platform 84 and first arm 86, an opening extends through structural layer 40 and surrounds first cantilevered platform structure 80 so that first platform 84 and first arm 86 are suspended over first recess 72.

Likewise, second cantilevered platform structure 82 includes a second platform 88 and a second arm 90 extending from second platform 88. Second MEMS device 46 resides on second platform 88, with an end of second arm 90 being a sole attachment point of second platform 88 to the surrounding bulk substrate 38. Accordingly, once the material portion of structural layer 40 is removed surrounding second platform 88 and second arm 90, an opening extends through structural layer 40 and surrounds second cantilevered platform structure 82 so that second platform 88 and second arm 90 are suspended over second recess 74.

Fabrication of such a structure may entail forming first and second recesses 72, 74 in bulk substrate 38 using, for example, an etch process, attaching structural layer 40 (e.g., in wafer form) to surface 42 of bulk substrate 38, and etching, sawing, or otherwise removing a portion of structural layer 40 to form first and second cantilevered platform structures 80, 82.

The illustrated configuration yields first MEMS device 44 formed on first cantilevered platform structure 80 that is suspended over first recess 72, and second MEMS device 46 formed on second cantilevered platform structure 82 that is suspended over second recess 74. Each of first and second cantilevered platform structures 80, 82 merely extends through the thickness of structural layer 40, instead of extending through the bulk, i.e., the entirety, of substrate 38. The cantilevered platform structure can achieve the benefits of improved package stress isolation, improved device performance, and a simplified package which reduces package costs.

In an embodiment, bond material 36 may be of a sufficient thickness such that cap element 24 is spaced apart from MEMS die 22. Thus, a first clearance space 92 is produced between first cantilevered platform structure 80 and cap element 24 and a second clearance space 94 is produced between second cantilevered platform structure 82 and cap element. Furthermore, bond material 36 is suitably deposited on structural layer 40 between first and second cantilevered platform structures 80, 82 so that bond material 36 forms a seal feature between first and second clearance spaces 92, 94. Thus, first MEMS device 44 is physically isolated from second MEMS device 46 such that the pressures that each of first and second MEMS devices 44, 46 are subjected to can be different. In alternative arrangements, a spacer ring or another suitable structure may be used to produce first and second clearance spaces 92 between first and second cantilevered platform structures 80, 82, respectively, and cap element 24, as well as to provide the physical isolation between first and second MEMS devices 44, 46.

A first vent 96 extends through substrate 38 to first recess 72. In addition, an opening 98 extends through die attach platform 30 of lead frame 26. Back side 28 of MEMS die 22 is coupled to die attach platform 30 such that first vent 96 is in fluid communication with opening 98. In other words, first vent 96 is aligned with opening 98 so that a fluid may pass through opening 98 and through first vent 96. MEMS differential pressure sensor package 20 is adapted for attachment to a vented customer board. As shown by way of example, MEMS package 20 is attached a customer board 100 (represented in dotted line form). Customer board 100 includes an opening 102 aligned with opening 98 in lead frame 26. Thus, a fluid (gas or liquid) from a first external environment 104 can flow through opening 102 and subsequently through opening 98 and first vent 96 to act on first MEMS device 44. A second vent 106 extends through cap element 24 to second clearance space 94. Thus, a fluid (gas or liquid) from a second external environment 108 can flow through second vent 106 to act on second MEMS device 46. It should be readily observed that another vent does not extend through substrate 38 to second recess 74. Similarly, another vent does not extend through cap element 24 to first clearance space 92.

A molded body 110 (e.g., a coating or a mold compound, such as a plastic material) is formed at least partially around MEMS die 22, cap element 24, lead frame 26, and IC die 58. Molded body 110 fully encapsulates bond pads 56, 60, and 66, as well as conductive interconnects 64, 70. Molded body 110 sufficiently protects conductive interconnects 64, 70 so that a gel fill, that may be used with prior art packages is not needed to protect them. Any desired encapsulant process may be used to protect MEMS die 22, cap element 24, lead frame 26, and IC die 58 from environmental conditions provided the first and second vents 96, 106 remain exposed. This may be accomplished by forming molded body 110 to be flush with the exposed portion of die attach platform 30 and electrical leads 68 of lead frame 26, and to be flush with the top of cap element 24 so that none of the mold compound used to for molded body 110 fills first and second vents 96, 106.

In an embodiment, first MEMS device 44 includes a first sense element residing on first platform 84 and adapted to detect a first pressure 112, labeled P1, of first external environment 104. Likewise, second MEMS device 46 includes a second sense element residing on second platform 88 and adapted to detect a second pressure 114, labeled P2, of second external environment 108. By way of example, the first sense element may be a first pressure sensor diaphragm 116 and the second sense element may be a second pressure sensor diaphragm 118. As such, a fluid (e.g., air) can pass through opening 102 in customer board 100, opening 98 in lead frame 26, and first vent 96, reach first clearance space 92, and act on first pressure sensor diaphragm 116 (e.g., cause its deformation). For example, first pressure sensor diaphragm 116 may move closer toward the underlying first platform 84. The deformation of first pressure sensor diaphragm 116 can be detected via, for example, a change in capacitance between first diaphragm 116 and first platform 84, and this change in capacitance is used to determine the value of first pressure 112 of the fluid in first external environment 104. Similarly, a fluid (e.g., air) can pass through second vent 106, reach second clearance space 94, and act on second pressure sensor diaphragm 118 to determine the value of second pressure 114 of the fluid in second external environment 108.

Thus formed, MEMS die 22 detects deflections in first pressure sensor diaphragm 116 in response to first pressure 112 and deflections in second pressure sensor diaphragm 118 in response to second pressure 114. The difference between first pressure 112 and second pressure 114 is the measured differential pressure. Accordingly, MEMS differential pressure sensor package 20 can be used to measure various properties, such as pressure drops across oil filters or air filter, fluid levels (by comparing the pressure above and below the fluid), flow rates (by measuring the change in pressure across a restriction), and so forth. Additionally, the differential sensing scheme of MEMS differential pressure sensor package 20 may be implemented in a gauge pressure sensor configuration in which one of first and second vents 96, 106 is open to the ambient atmosphere.

Figure 3:
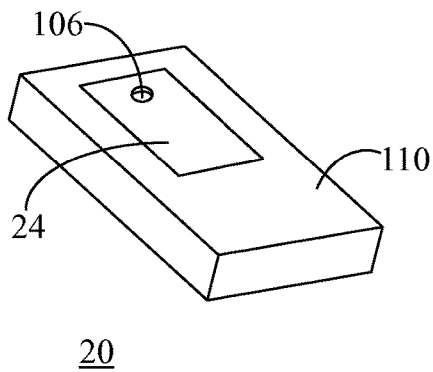
FIG. 3 shows an isometric top view of the MEMS differential pressure sensor package of FIG. 1.
Figure 4:
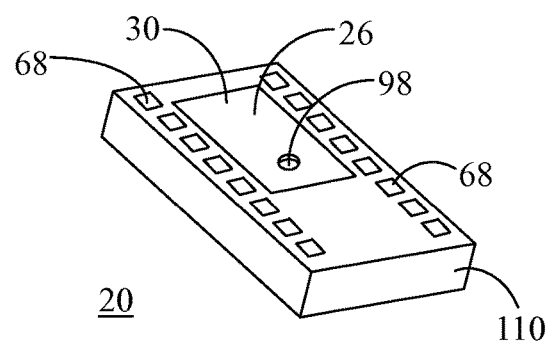
FIG. 4 shows an isometric bottom view of the MEMS differential pressure sensor package of FIG. 1.

Referring to FIGS. 3 and 4, FIG. 3 shows an isometric top view of MEMS differential pressure sensor package 20 and FIG. 4 shows an isometric bottom view of MEMS differential pressure sensor package 20. As shown in the top view of FIG. 3, MEMS differential pressure sensor package 20 includes an exposed top surface of cap element 24 in which second vent 106 is formed. The exposed surface of cap element 24 is flush with and sealed against the top surface of molded body 110. As shown in the bottom view of FIG. 4, MEMS differential pressure sensor package 20 includes an exposed portion of electrical leads 68 and die attach platform 30 of lead frame 26 in which opening 98 is formed. The exposed portions of lead frame 26 are flush with and sealed against the bottom surface of molded body 110.

Thus, molded body 110 shields the sensitive components of MEMS differential pressure sensor package 20 from corrosive element while allowing first pressure sensor diaphragm 116 (FIG. 1) to have unfettered access to external pressure conditions through opening 98 in lead frame 26 and additionally allowing second pressure sensor diaphragm 118 (FIG. 1) to have unfettered access to external pressure conditions through second vent 106.

FIG. 5 shows a side view of a MEMS differential pressure sensor package 120 in accordance with another embodiment. As discussed previously, IC die 58 (FIG. 1) of MEMS differential pressure sensor package 20 is directly coupled to die attach platform 30 of lead frame 26. In contrast, MEMS differential pressure sensor package 120 represents a configuration in which the cap element is an integrated circuit (IC) die 122 coupled to MEMS die 22. IC die 122 serves as a lid or cap for MEMS devices 44, 46. Accordingly, an additional capping substrate (e.g., cap element 24 shown in FIG. 1) is not required. As such, savings can be achieved in terms of at least the material costs for the capping substrate. For clarity of description, the elements of MEMS differential pressure sensor package 120 that are equivalent to elements previously described in connection with MEMS differential pressure sensor package 20 of FIGS. 1-4 will share the same reference numerals and will share the same shading and/or hatching. A detailed description of those equivalent elements will not be repeated below for brevity.

In general, MEMS differential pressure sensor package 120 includes MEMS die 22 coupled to lead frame 26, and IC die 122 coupled to MEMS die 22 and in a stacked relationship with first and second MEMS devices 44, 46. MEMS die 22 includes bulk substrate 38 having first and second recesses 72, 74 formed therein, first cantilevered platform structure 80, second cantilevered platform structure 82, first MEMS device 44 residing on first platform 84 of first cantilevered platform structure 80, and second MEMS device 46 residing on second platform 88 of second cantilevered platform structure 82. In addition, first vent 96 extends through bulk substrate 38 to first recess 72, and lead frame 26 includes opening 98 in fluid communication with first vent 96 so that first MEMS device 44 residing on first platform 84 can be vented to first external environment 104.

IC die 122, as a cap element, is spaced apart from MEMS die 22 to provide first clearance space 92 between MEMS device 44 and IC die 122 and to provide second clearance space 94 between MEMS device 46 and IC die 122. Top side 32 of MEMS die 22 is coupled to an inner surface 124 of IC die 122 in a stacked relationship via bond material 36, where bonding may be, for example, aluminum-germanium bonding, copper-to-copper bonding, or any other suitable bonding process and bonding material. Again, bond material 36 is suitably deposited on structural layer 40 between first and second cantilevered platform structures 80, 82 so that bond material 36 forms a seal feature between first and second clearance spaces 92, 94. Thus, first MEMS device 44 is physically isolated from second MEMS device 46.

In accordance with an embodiment, a second vent 126 extends through IC die 122 from an outer surface 128 of IC die 122 to second clearance space 94 so that second MEMS device 46 residing on second platform 88 can be vented to second external environment 108. In addition, through-vias 130 may extend through IC die 122 at locations that are laterally displaced away from second vent 126. The term "through-via" used herein denotes an electrically-conductive element, such as metallization formed through one or more dielectric layers and electrically coupling electrical conductors formed on different surfaces of IC die 122. In this example, through-vias 130 extend from inner surface 124 to outer surface 128 of IC die 122.

In some configurations, through-vias 130 may be electrically connected to bond pads 132 on outer surface 128 of IC die 122. In the illustrated embodiment, bond pads 132 on outer surface 128 of IC die 24 are interconnected with electrical leads 68 of lead frame 36 via bond wires 134 to provide input to and output from MEMS differential pressure sensor package 120. Additionally, or alternatively, through-vias 130 may be electrically interconnected with MEMS die 22. For example, conductive traces 50, 54 may terminate at electrical contacts 48, 52, respectively. Electrically conductive bond material 36 may be used to form the electrical connection between electrical contacts 48 associated with first MEMS device 44 and a portion of through-vias 130 and/or to form the electrical connection between electrical contacts 52 associated with second MEMS device 46 and another portion of through-vias 130.

Second vent 126 and through-vias 130 may be formed with any known technique. Additionally, second vent 126 and through-vias 130 may be formed concurrently by, for example, etching IC die 122 to produce openings extending through the thickness of IC die 122. A subset of the openings are subsequently filled with a conductive material, for example, a metal material to form through-vias 130. A remaining opening is not filled with the conductive material to yield second vent 126.

A molded body 136 (e.g., a coating or a mold compound, such as a plastic material) is formed at least partially around MEMS die 22, lead frame 26, and IC die 122. Molded body 136 fully encapsulates bond pads 132 and bond wires 134 to sufficiently protect wire bonds 68 so that a subsequent gel fill may not be needed to protect them.

Molded body 136 may be flush with the exposed portion of electrical leads 68 of lead frame 26 so that none of the mold compound used to produce molded body 136 fills first vent 96. It should be observed that a void 138 is formed in molded body 136 so that molded body 136 does not cover access second vent 126. Void 138 may be formed using any suitable technique. For example, an insert may be used to form void 138 during execution of a film assisted molding process.

Figure 6:
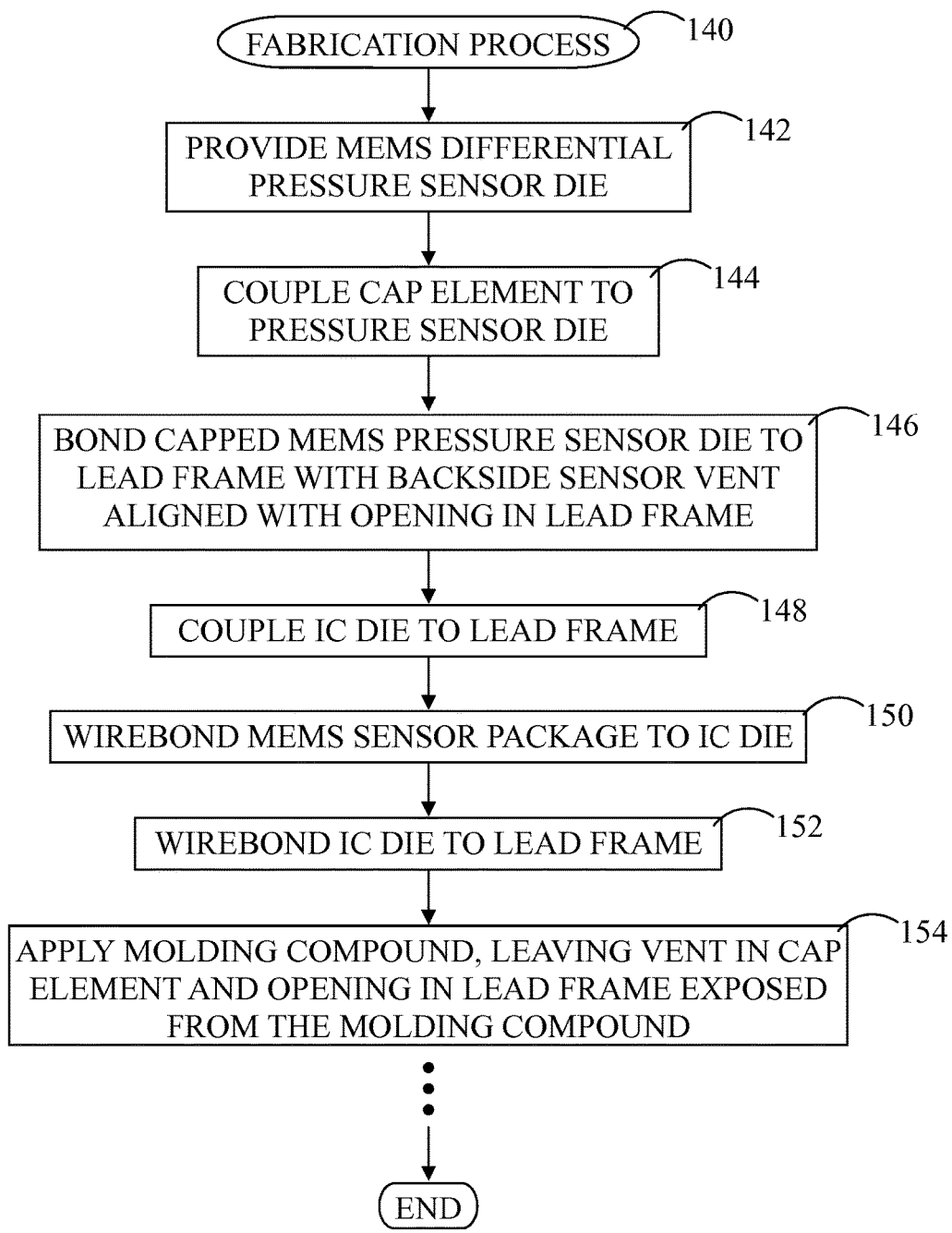
FIG. 6 shows a flowchart of a fabrication process for fabricating the MEMS differential pressure sensor package of FIGS. 1-4.

Referring to FIGS. 1 and 6, FIG. 6 shows a flowchart of a fabrication process 140 for fabricating MEMS differential pressure sensor package 20. Fabrication process 140 will be described in the context of fabricating a single MEMS package, for example, MEMS differential pressure sensor package 20, for simplicity of illustration. It should be apparent however, that fabrication process 140 can be readily implemented to form a plurality of MEMS differential pressure sensor packages 20 in accordance with a wafer-level packaging process. Additionally, although a particular, exemplary method of fabricating MEMS differential pressure sensor package 20 is described in conjunction with FIG. 6, it is to be understood that other fabrication methodologies may alternatively be used to produce MEMS differential pressure sensor package 20. As such, the exemplary fabrication method of FIG. 6 is not to be construed as limiting, but is instead provided as an example of a possible fabrication method that may be implemented.

In a block 142 of fabrication process 140, a differential pressure sensor die, e.g., MEMS die 22, is provided. As described in detail above, MEMS die 22 includes substrate 38, first and second cantilevered platform structures 80, 82, and first and second MEMS devices 44, 46. Substrate 38 has first and second recesses 72, 74 formed therein. First cantilevered platform structure 80 has first platform 84 and first arm 86 extending from first platform 84, wherein first platform 84 and first arm 86 are suspended over first recess 72. First arm 86 is fixed to substrate 38 and first MEMS device 44 resides on first platform 84. Second cantilevered platform structure 82 has second platform 88 and second arm 90 extending from second platform 88, wherein second platform 88 and second arm 90 are suspended over second recess 74. Second arm 90 is fixed to substrate 38 and second MEMS device 46 resides on second platform 88. Again, MEMS die 22 may be a pressure sensor die and first and second MEMS devices 44, 46 can include their respective first and second pressure sensor diaphragms 116, 118.

In a block 144, cap element 24 is coupled to MEMS die 22 via bond material 36 in a stacked relationship as discussed in detail above. In a block 146, the capped MEMS pressure sensor die 22 is bonded to die attach platform 30 of lead frame 26 with the backside sensor vent, e.g., first vent 96, aligned with opening 98 in die attach platform 30. In a block 148, IC die 58 is coupled to die attach platform 30 of lead frame 26.

In a block 150, the capped MEMS pressure sensor die 22 is electrically interconnected with IC die 58. That is, conductive interconnects 64, e.g., bond wires, are interconnected between bond pads 56 and bond pads 60 by performing, for example, a wire bonding process. In a block 152, IC die 58 is electrically interconnected with electrical leads 68 of lead frame 26. That is, conductive interconnects 70, e.g., bond wires, are interconnected between bond pads 66 and electrical leads 68 by performing, for example, a wire bonding process. In a block 154, molding compound is applied to the structure to form molded body 110, leaving second vent 106 in cap element 24 and opening 98 in lead frame 28 exposed from the molding compound. Following molding block 154, additional tasks associated with fabrication process 140 may be performed as represented by ellipses. Thereafter, fabrication process 140 ends.

Figure 7:
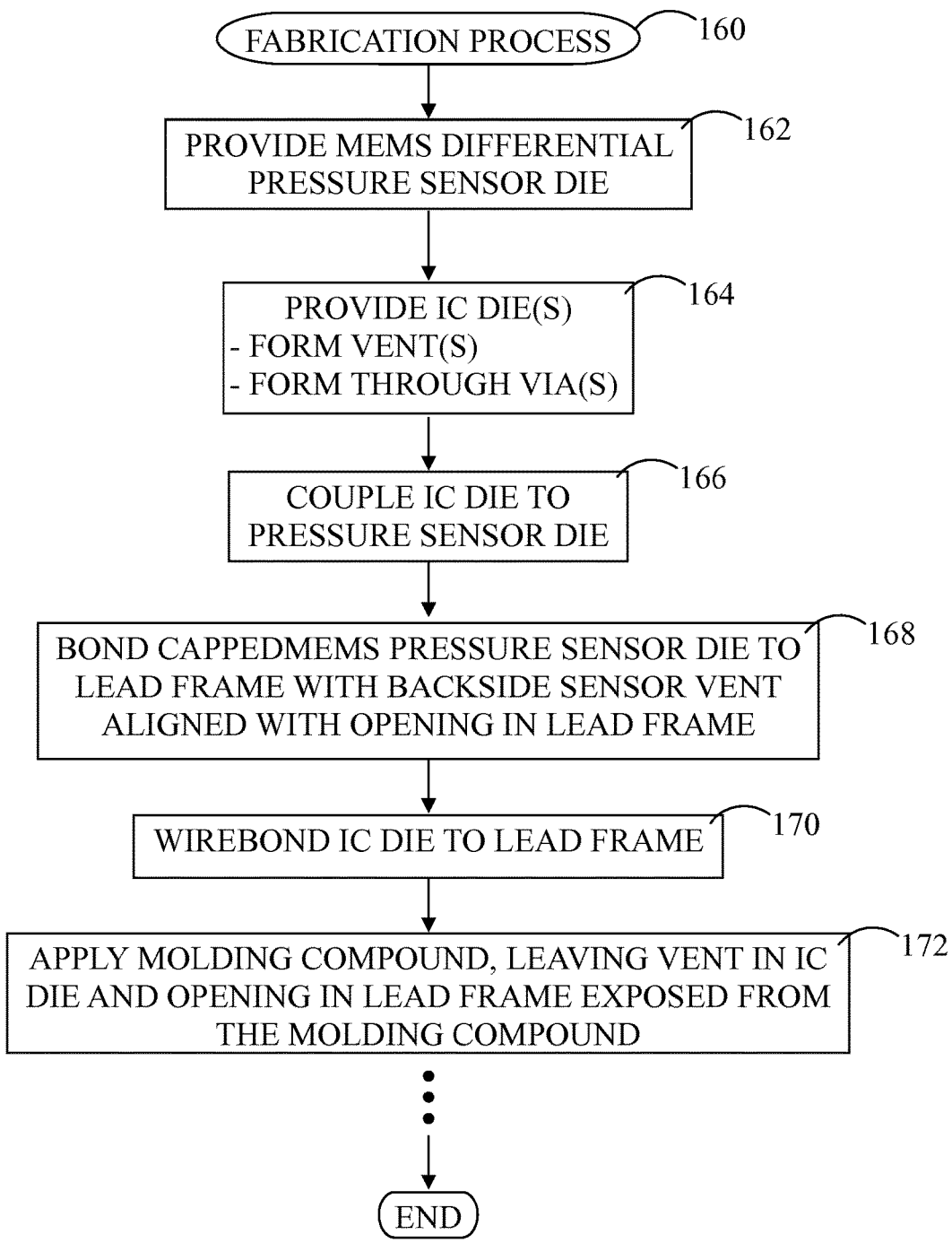
FIG. 7 shows a flowchart of a fabrication process for fabricating the MEMS differential pressure sensor package of FIG. 5.

Referring to FIGS. 5 and 7, FIG. 7 shows a flowchart of a fabrication process 160 for fabricating MEMS differential pressure sensor package 120. Fabrication process 160 will be described in the context of fabricating a single MEMS package, for example, MEMS differential pressure sensor package 120, for simplicity of illustration. It should be apparent however, that fabrication process 160 can be readily implemented to form a plurality of MEMS differential pressure sensor packages 120 in accordance with a wafer-level packaging process. Furthermore, it is to be understood that other fabrication methodologies may alternatively be used to produce MEMS differential pressure sensor package 120.

In a block 162 of fabrication process 160 a differential pressure sensor die, e.g., MEMS die 22, is provided. In a block 164, IC die 122 is provided with one or more second vents 126 and one or more through-vias 130 formed therein. In a block 166, IC die 122, as a cap element, is coupled to MEMS die 22 via bond material 36 in a stacked relationship as discussed in detail above. In a block 168, the MEMS pressure sensor die 22 capped with IC die 122 is bonded to die attach platform 30 of lead frame 26 with the backside sensor vent, e.g., first vent 96, aligned with opening 98 in die attach platform 30.

In a block 170, IC die 122 is electrically interconnected with electrical leads 68 of lead frame 26. That is, conductive interconnects 134, e.g., bond wires, are interconnected between bond pads 132 and electrical leads 68 by performing, for example, a wire bonding process. In a block 172, molding compound is applied to the structure to form molded body 136 with second vent 126 in IC die 122 and opening 98 in lead frame 28 exposed from the molding compound. Following molding block 172, additional tasks associated with fabrication process 160 may be performed as represented by ellipses. Thereafter, fabrication process 160 ends.

It is to be understood that certain ones of the process blocks depicted in FIGS. 6 and 7 may be performed in parallel with each other or with performing other processes. In addition, it is to be understood that the particular ordering of the process blocks depicted in FIGS. 6 and 7 may be modified, while achieving substantially the same result. Accordingly, such modifications are intended to be included within the scope of the inventive subject matter. In addition, although particular system configurations are described in conjunction with FIGS. 1-5, above, embodiments may be implemented in systems having other architectures, as well. These and other variations are intended to be included within the scope of the inventive subject matter.

In summary, stress isolated microelectromechanical systems (MEMS) device packages and methodology for fabricating the MEMS device packages are described. A MEMS device package entails a differential pressure sensor package configuration in which two pressure sensors are built on the same MEMS die. The pressure sensors are physically isolated from one another so that their pressures are different, and each pressure sensor has its own individual vent, where one vent is in the top of the package through a cap element for one pressure sensor and the other vent is through the base of the MEMS differential pressure sensor package for the other pressure sensor. Additionally, each pressure sensor is formed on its own cantilevered platform structure which is connected to a bulk substrate at a sole attachment point. Such a configuration enables differential pressure sensing, while providing isolation of the pressure sensors from outside stresses such as packaging and/or thermal stresses. Such a structural configuration and fabrication methodology enables a cost effective differential pressure sensor packaging solution in a compact form factor that does not sacrifice part performance and that additionally does not require gel fill.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Further, the phraseology or terminology employed herein is for the purpose of description and not of limitation. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A package comprising:
   a microelectromechanical systems (MEMS) die including:
      a substrate having a first recess and a second recess formed therein, said substrate having a first vent extending through said substrate to said first recess;
      a first cantilevered platform structure is suspended over said first recess;
      a second cantilevered platform structure is suspended over said second recess;
      a first MEMS device residing on said first cantilevered platform structure; and
      a second MEMS device residing on said second cantilevered platform structure; and
   a cap element coupled to and in a stacked relationship with said first and second cantilevered platform structures, said cap element being spaced apart from said MEMS die to provide a first clearance space between said first MEMS device and said cap element, and to provide a second clearance space between said second MEMS device and said cap element, said cap element having a second vent extending through said cap element to said second clearance space.

2. The package of claim 1 further comprising a seal feature physically isolating said second MEMS device from said first MEMS device.

3. The package of claim 1 wherein said substrate does not have another vent extending through said substrate to said second recess.

4. The package of claim 1 wherein said cap element does not have another vent extending through said cap element to said first clearance space.

5. The package of claim 1 wherein said cap element comprises an integrated circuit (IC) die.

6. The package of claim 5 further comprising a through-via extending through said IC die, said through-via being electrically interconnected with said MEMS die.

7. The package of claim 6 further comprising an electrical contact provided on an outer surface of said IC die, wherein said through-via is electrically connected with said electrical contact.

8. The package of claim 5 wherein said second vent extending through said IC die is laterally displaced away from said through-via.

9. The package of claim 1 further comprising a structural layer fixed to a surface of said substrate surrounding each of said first and second recesses, wherein:
   said first cantilevered platform structure includes a first platform and a first arm extending from said first platform, said first MEMS device residing on said first platform, and said first arm being a sole attachment point of said first platform to said substrate surrounding said first recess; and
   said second cantilevered platform structure includes a second platform and a second arm extending from said second platform, said second MEMS device residing on said second platform, and said second arm being a sole attachment point of said second platform to said substrate surrounding said second recess.

10. The package of claim 1 wherein said MEMS die comprises a differential pressure sensor die, said first MEMS device comprises a first sensor element residing on said first cantilevered platform structure and adapted to detect a first pressure, and said second MEMS device comprises a second sensor element residing on said second cantilevered platform structure and adapted to detect a second pressure.

11. A package comprising:
   a microelectromechanical systems (MEMS) pressure sensor die including:
      a substrate having a first recess and a second recess formed therein, said substrate having a first vent extending through said substrate to said first recess;
      a first cantilevered platform structure suspended over said first recess;
      a second cantilevered platform structure suspended over said second recess;
      a first pressure sensor element residing on said first cantilevered platform structure; and
      a second pressure sensor element residing on said second cantilevered platform structure;
   a lead frame having a die attach platform in which an opening is formed, wherein a back side of said substrate is coupled to said die attach platform with said first vent in fluid communication with said opening; and
   a cap element coupled to and in stacked relationship with said first and second cantilevered platform structures, said cap element being spaced apart from said MEMS pressure sensor die to provide a first clearance space between said first pressure sensor element and said cap element, and to provide a second clearance space between said second pressure sensor element and said cap element, said cap element having a second vent extending through said cap element to said second clearance space.

12. The package of claim 11 wherein:
   said first pressure sensor element is vented to a first external environment via said first vent in said substrate and is adapted to detect a first pressure of said first external environment; and
   said second pressure sensor element is vented to a second external environment via said second vent in said cap element and is adapted to detect a second pressure of said second external environment.

13. The package of claim 11 further comprising a seal feature physically isolating said second pressure sensor element from said first pressure sensor element.

14. The package of claim 11 wherein:
   said substrate does not have another vent extending through said substrate to said second recess; and
   said cap element does not have another vent extending through said cap element to said first clearance space.

15. The package of claim 11 wherein said cap element comprises an integrated circuit (IC) die, said second vent extends through said IC die.

16. The package of claim 15 wherein said IC die includes a through-via extending through said IC die, said through-via being laterally displaced away from said second vent, and said through-via being electrically interconnected with said MEMS die.

17. The package of claim 11 further comprising a structural layer fixed to a surface of said substrate surrounding each of said first and second recesses, wherein:
   said first cantilevered platform structure includes a first platform and a first arm extending from said first platform, said first MEMS device residing on said first platform, and said first arm being a sole attachment point of said first platform to said substrate surrounding said first recess; and
   said second cantilevered platform structure includes a second platform and a second arm extending from said second platform, said second MEMS device residing on said second platform, and said second arm being a sole attachment point of said second platform to said substrate surrounding said second recess.

18. The differential pressure sensor of claim 11 further comprising a molded body formed at least partially around said pressure sensor die, said lead frame, and said cap element without covering said first and second vents.

19. A method of making a MEMS differential pressure sensor package comprising:
   providing a MEMS die, said MEMS die including a substrate, a first cantilevered platform structure, a second cantilevered platform structure, a first MEMS device, and a second MEMS device, said substrate having first and second recesses formed therein, said substrate having a first vent extending through said substrate to said first recess, said first cantilevered platform structure being suspended over said first recess, said second cantilevered platform structure being suspended over said second recess, said first MEMS device residing on said first cantilevered platform structure, and said second MEMS device residing on said second cantilevered platform structure;
   coupling a cap element to said MEMS die in a stacked relationship such that said cap element is spaced apart from said MEMS die to provide a first clearance space between said first MEMS device and said cap element, to provide a second clearance space between said second MEMS device and said cap element, and to physically isolate said second MEMS device from said first MEMS device; and
   bonding a backside of said substrate to a die attach platform of a lead frame, said die attach platform having an opening formed therein, and said bonding aligning said first vent with said opening.

20. The method of claim 19 wherein said MEMS die comprises a differential pressure sensor die, said first MEMS device includes a first pressure sensor element adapted to detect a first pressure, and said second MEMS devices includes a second pressure sensor element adapted to detect a second pressure, and wherein following said coupling and said bonding, said first pressure sensor element is vented to a first external environment via said first vent in said substrate, and said second pressure sensor element is vented to a second external environment via said second vent in said cap element.

* * * * *